(12) United States Patent
Fehr et al.

(10) Patent No.: US 9,920,414 B2
(45) Date of Patent: Mar. 20, 2018

(54) METHOD FOR PRODUCING A CERAMIC LAYER ON A SURFACE FORMED FROM AN NI BASE ALLOY

(71) Applicant: Fraunhofer-Gesellschaft zur Förderung der angewandten Forschung e. V., Munich (DE)

(72) Inventors: Karl Thomas Fehr, Munich (DE); Yaping Ye, Zhejiang (CN); Gerhard Wolf, Hirschau (DE)

(73) Assignee: FRAUNHOFER-GESELLSCHAFT ZUR FÖRDERUNG DER ANGEWANDTEN FORSCHUNG E. V., Munich (DE)

( * ) Notice: Subject to any disclaimer, the term of this patent is extended or adjusted under 35 U.S.C. 154(b) by 14 days.

(21) Appl. No.: 14/372,391

(22) PCT Filed: Jan. 14, 2013

(86) PCT No.: PCT/EP2013/050577
§ 371 (c)(1),
(2) Date: Jul. 15, 2014

(87) PCT Pub. No.: WO2013/107712
PCT Pub. Date: Jul. 25, 2013

(65) Prior Publication Data
US 2015/0056436 A1 Feb. 26, 2015

(30) Foreign Application Priority Data
Jan. 16, 2012 (DE) .................. 10 2012 200 560

(51) Int. Cl.
C23C 4/18 (2006.01)
C23C 4/11 (2016.01)
(Continued)

(52) U.S. Cl.
CPC .............. *C23C 4/18* (2013.01); *C23C 4/11* (2016.01); *C23C 4/134* (2016.01); *C23C 14/08* (2013.01);
(Continued)

(58) Field of Classification Search
CPC ....... C23C 14/5853; C23C 4/105; C23C 4/18; C23C 4/11; C23C 4/134; C23C 4/127;
(Continued)

(56) References Cited

U.S. PATENT DOCUMENTS 4,966,820 A    10/1990   Kojima et al.
5,035,957 A *   7/1991   Bartlett .................... C23C 8/10
                                                         148/DIG. 117
(Continued)

FOREIGN PATENT DOCUMENTS

DE    68911363 T2    6/1994
DE    19918900 A1    10/1999
(Continued)

OTHER PUBLICATIONS

Masset, et al "Chemical densification of oxide based coatings for high temperature wear and corrosion resistance", Abstract #2336, Honolulu PRiME 2012, © 2012 The Electrochemical Society, 1 page.*
(Continued)

*Primary Examiner* — Katherine A Bareford
(74) *Attorney, Agent, or Firm* — Manabu Kanesaka

(57) ABSTRACT

A method for producing a ceramic layer on a surface formed from a Ni base alloy, includes the following steps: producing on the surface a ceramic layer containing $ZrO_2$ as a main constituent; producing a gas phase having a temperature in the range from 400 to 900° C., in which a vapor formed from a salt melt with the components alkali chloride, alkali sulphate and $ZnCl_2$ is contained in a carrier gas formed from (Continued)

an inert gas with an addition from 0.5 to 10% by weight HCl; and bringing the ceramic layer into contact with the gas phase for a period of time that is sufficient for an intermediate layer having a thickness of at least 0.1 µm to form between the ceramic layer and the surface.

13 Claims, 5 Drawing Sheets

(51) Int. Cl.
| | |
|---|---|
| *C23C 14/58* | (2006.01) |
| *C23C 14/08* | (2006.01) |
| *C23C 16/02* | (2006.01) |
| *C23C 16/40* | (2006.01) |
| *C23C 16/56* | (2006.01) |
| *F01D 5/28* | (2006.01) |
| *C23C 14/24* | (2006.01) |
| *C23C 4/134* | (2016.01) |

(52) U.S. Cl.
CPC ......... *C23C 14/081* (2013.01); *C23C 14/083* (2013.01); *C23C 14/24* (2013.01); *C23C 14/58* (2013.01); *C23C 14/5853* (2013.01); *C23C 16/0272* (2013.01); *C23C 16/405* (2013.01); *C23C 16/56* (2013.01); *F01D 5/284* (2013.01); *F01D 5/288* (2013.01); *F05D 2230/313* (2013.01); *F05D 2230/314* (2013.01); *Y10T 428/249961* (2015.04); *Y10T 428/249987* (2015.04)

(58) Field of Classification Search
CPC ....... C23C 14/58; C23C 14/083; C23C 14/08; C23C 14/24; C23C 14/081; C23C 16/0272; C23C 16/405; C23C 16/56; C23C 16/40; C23C 16/4481; F01D 5/284; F01D 5/288; F05D 2230/313; F05D 2230/314; Y10T 428/249987; Y10T 428/249961
USPC ............ 427/574, 335, 255.4, 255.23, 255.39
See application file for complete search history.

(56) References Cited

U.S. PATENT DOCUMENTS

| | | | |
|---|---|---|---|
| 5,955,182 A | | 9/1999 | Yasuda et al. |
| 6,328,818 B1 * | | 12/2001 | Miyagi .................. C23C 10/24 148/209 |
| 6,398,503 B1 | | 6/2002 | Takahashi et al. |
| 6,565,820 B1 * | | 5/2003 | Weimer .................. B01J 35/12 423/240 S |
| 7,326,470 B2 | | 2/2008 | Ulion et al. |
| 7,901,790 B2 | | 3/2011 | Arikawa et al. |
| 2003/0203224 A1 | | 10/2003 | Diconza et al. |
| 2007/0207328 A1 | | 9/2007 | Frost et al. |
| 2008/0145629 A1 | | 6/2008 | Anoshkina et al. |
| 2009/0311508 A1 | | 12/2009 | Stamm et al. |

FOREIGN PATENT DOCUMENTS

| | | |
|---|---|---|
| EP | 0605196 A1 | 7/1994 |
| EP | 0816526 A2 | 1/1998 |
| EP | 1591550 A1 | 11/2005 |
| EP | 1640477 A2 | 3/2006 |
| EP | 1829984 A1 | 9/2007 |
| EP | 2309024 A2 | 4/2011 |
| WO | 2007/112783 A1 | 10/2007 |

OTHER PUBLICATIONS

PCT, "International Preliminary Report on Patentability for International Application No. PCT/EP2013/050577.", dated 2014.
Portinha, A. et al., "Characterization of thermal barrier coatings with a gradient in porosity," Surface & Coatings Technology, 2005, pp. 245-251, vol. 195, Elsevier.
Lima, C.R.C. et al., "Temperature Measurements and Adhesion Properties of Plasma Sprayed Thermal Barrier Coatings," Journal of Thermal Spray Technology, 1999, p. 323-327, vol. 8, ASM International.
Guo, H.B. et al., "Atmospheric plasma sprayed thick thermal barrier coatings with high segmentation crack density," Surface & Coatings Technology, 2004, p. 353-363, vol. 186, Elsevier.
Steffens, H.-D et al., "Some Aspects of Thick Thermal Barrier Coating Lifetime Prolongation," Journal of Thermal Spray Technology, 1999, p. 517-522, vol. 8, ASM International.
Yoshiba, M. et al., "High-Temperature Oxidation and Hot Corrosion Behavior of Two Kinds of Thermal Barrier Coating Systems for Advanced Gas Turbines," Journal of Thermal Spray Technology, 1996, p. 259-268, vol. 5, ASM International.
Ye et al., "Chemical Densification of plasma sprayed ytteria stabilized zirconia (YSZ) coatings for high temperature wear and corrosion resistance", Applied Surface Science 263 (2017) 827.
Fehr et al., "Ein neues Verfahren zur Optimierung oxidkeamischer Schutzschichten", Moderne Beschichtungen zum Verschleißschutz von Werkzeugen, Faulstich et al., Eds., Dorner PrintConcept GmbH & Co. 2012, vol. 7. pp. 51-78.

* cited by examiner

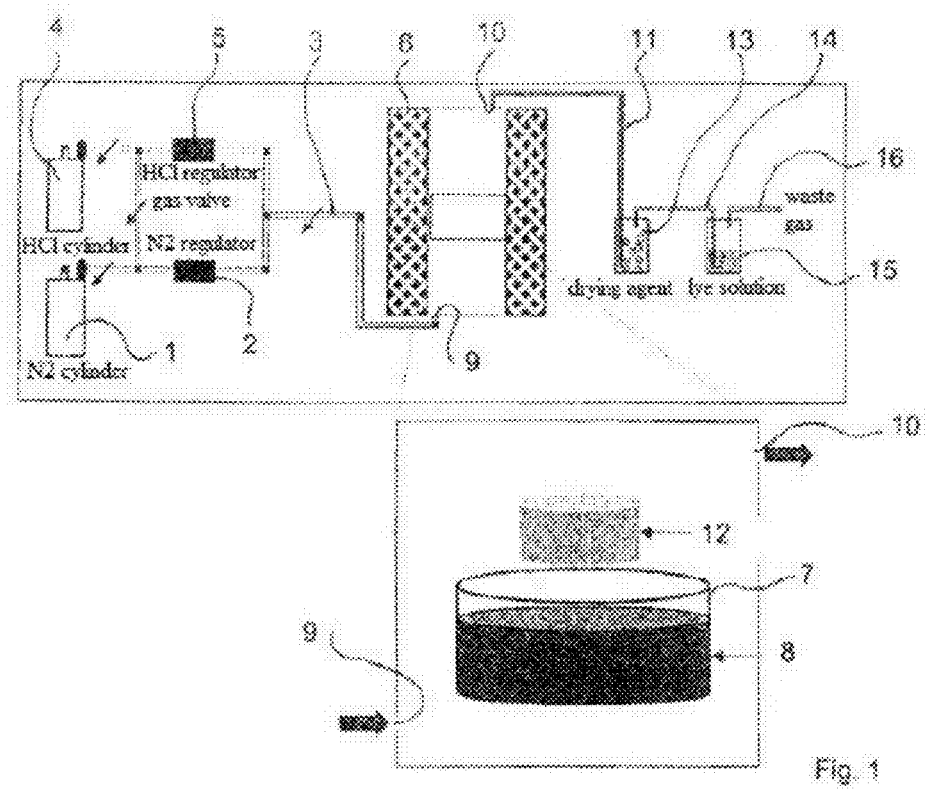
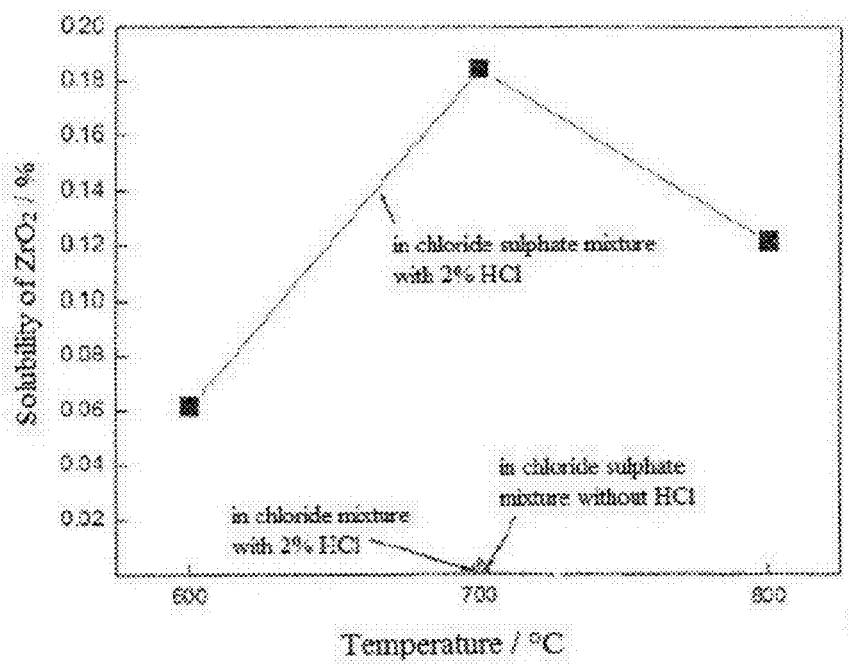

METHOD FOR PRODUCING A CERAMIC LAYER ON A SURFACE FORMED FROM AN NI BASE ALLOY

RELATED APPLICATIONS

The present application is National Phase of International Application No. PCT/EP2013/050577 filed Jan. 14, 2013, and claims priority from German Application No. 10 2012 200 560.9, filed Jan. 16, 2012.

BACKGROUND OF THE INVENTION

The invention relates to a method for producing a ceramic layer on a surface formed from a Ni base alloy.

According to the prior art, it is known for example from Yoshiba, M. et al., "High-Temperature Oxidation and Hot Corrosion Behavior to Two Kinds of Thermal Barrier Coating Systems for Advances Gas Turbines", J. Therm. Spray Tech. 5 (1996), 259-268 that ceramic protective layers can be applied to Ni base alloys, for example by means of plasma spraying. The ceramic protective layers are usually oxide-ceramic protective layers, in particular $ZrO_2$ stabilised with $Y_2O_3$ (YSZ). Ceramic protective layers of this type improve the corrosion resistance and the wear resistance of a component coated therewith. Apart from this, such ceramic protective layers are used for thermal insulation of components in turbine and engine construction due to their low thermal conductivity and their high reflecting power.

Contact with hot corrosive media results disadvantageously in a flaking of the ceramic protective layers. Yoshiba et al. (see above) observed in hot corrosion tests that an application of a salt melt formed from $Na_2SO_4$ and NaCl to a ceramic layer contributes to an improvement of the adhesiveness.

DE 689 11 363 T2 discloses an object which is produced from a Ni base alloy and which is coated with a ceramic protective layer formed from YSZ. To improve the adhesiveness, one or more intermediate layers is/are first deposited on the object prior to the application of the ceramic protective layer.

Lima, C. R. C.; da Exaltação Trevisan, R.: Temperature Measurements and Adhesion Properties of Plasma Sprayed Thermal Barrier Coatings in Journal of Thermal Spray Technology, 8, 1999, 2, 323-327 discloses a method in which first an intermediate layer formed from a metal and a ceramic and then a ceramic layer containing $ZrO_2$ as a main constituent are applied by means of plasma spraying to a substrate produced from a Ni base alloy.

Guo, H. B.; Vaβen R.; Stöver D.: Atmospheric plasma sprayed thick thermal barrier coatings with high segmentation crack density in: Surface & Coatings Technology 186, 2004, 353-363 discloses a method in which a mixture of a polymer and a $ZrO_2$ stabilised with yttrium is applied by means of plasma spraying to substrate produced from a Ni base alloy. The porous ceramic layer with $ZrO_2$ as main constituent thus produced has an improved thermal cycle stability.

The object of the invention is to overcome the disadvantages according to the prior art. In particular, a method for producing a particularly adhesive ceramic layer on a surface formed from a Ni base alloy is to be specified.

This object is achieved by the features of the invention. Expedient embodiments of the invention will emerge from the features of the invention.

BRIEF SUMMARY OF THE INVENTION

According to the invention, a method for producing a ceramic layer on a surface formed from a Ni base alloy comprising the following steps is proposed:
producing on the surface a ceramic layer containing $ZrO_2$ as a main constituent;
producing a gas phase having a temperature in the range from 400 to 900° C., in which a vapour formed from a salt melt with the components alkali chloride, alkali sulphate and $ZnCl_2$ is contained in a carrier gas formed from an inert gas with a 5 to 10% by weight HCl; and
bringing the ceramic layer into contact with the gas phase for a period of time that is sufficient for an intermediate layer having a thickness of at least 0.1 μm to form between the ceramic layer and the surface.

The ceramic layer produced with the method according to the invention has a drastically improved adhesiveness. Further, the ceramic layer is characterised by an improved hardness and a reduced porosity.

It is assumed that the components contained in the gas phase form a quaternary eutectic with $ZrO_2$ in the specified temperature range. It is also assumed that the HCl contained in the gas phase reacts with chromium contained in the Ni base alloy to form chromium chlorides. As a result of the chemical potential difference, the chromium chlorides diffuse in the direction of the ceramic layer. The fluid containing $ZrO_2$ diffuses in the direction of the interface formed from the Ni base alloy. In the region of the interface, recrystallization occurs, in particular of the dissolved $ZrO_2$, and an intermediate layer is thus formed. Here, the porosity of the ceramic layer reduces in the region of the interface. The proposed method of dissolution, rearrangement and recrystallisation of the ceramic material under the action of a hot salt-containing gas phase is a "solvothermal method".

The Ni base alloy is expediently a conventional Ni base alloy. The Ni base alloy contains Cr, advantageously in a quantity from 15 to 25% by weight.

The ceramic layer can be produced by means of PVD (Physical Vapor Deposition) or in particular also by thermal spraying. Thermal spraying may be plasma spraying in particular.

In accordance with a further advantageous embodiment of the invention, the ceramic layer contains $Y_2O_3$ as a secondary constituent in order to stabilise the $ZrO_2$. The content of $Y_2O_3$ may be 4 to 8 mol %.

The ceramic layer can contain $Al_2O_3$ as a further main constituent. The content of $Al_2O_3$ may be in the range from 30 to 70 mol %, preferably in the range from 40 to 60 mol %, particularly preferably in the region of 50 mol %.

To produce the carrier gas, $N_2$ can be used expediently as inert gas. Further, the carrier gas may expediently contain 1.0 to 4.0% by weight HCl.

In particular, salts which contain Na, K or Li as alkali can be considered as alkali chloride and alkali sulphate. In accordance with a particularly advantageous embodiment of the invention, the salt melt contains $ZnSO_4$ as a further component. In particular, the salt melt may contain the following components: $KCl$—$K_2SO_4$—$ZnCl_2$—$ZnSO_4$. A salt melt with the aforementioned components forms a quaternary eutectic, which allows the method to be carried out with a temperature of the gas phase in the region of 700° C.—It has been found to be expedient if the components are contained in substantially equimolar composition in the salt melt. The composition can deviate from the equimolar composition by at most 5 mol %, preferably less than 3 mol %, particularly preferably less than 1 mol %.

The ceramic layer is advantageously brought into contact with the gas phase for a period of time that is sufficient for an intermediate layer having a thickness from 0.5 to 5.0 μm to form between the ceramic layer and the surface. The period of time to be selected is dependent on the composition of the salt melt, the pressure and the temperature. With a pressure of the gas phase from 1000 to 1500 hPa, this period is in the range from 1 to 100 hours, preferably 20 to 75 hours. The period of time for which the ceramic layer is brought into contact with the gas phase can be reduced by an increase of the pressure.

In accordance with a further provision of the invention, an object having a surface formed from a Ni base alloy is proposed, wherein the surface is coated, with intermediate arrangement of an intermediate layer, with a ceramic layer containing $ZrO_2$ as a main constituent, and wherein the ceramic layer has an adhesiveness of at least 10 MPa. To determine the adhesiveness, the test specimens were heated to a temperature of 1100° C. and were held at this temperature for 30 min. The test specimens were then removed from the furnace and cooled in air to room temperature. The cycle described above was repeated 20 times. The adhesiveness was then determined in a shear test using the STM 20-A shear test apparatus from the company Walter & Bai AG.

In accordance with a further provision of the invention, an object having a surface formed from a Ni base alloy is proposed, wherein the surface is coated, with intermediate arrangement of an intermediate layer, with a ceramic layer containing $ZrO_2$ as a main constituent, and wherein the ceramic layer has a thermal cycle stability of more than 4. To determine the thermal cycle stability, the test specimens were heated in air cyclically as described above to 1100° C. in an electric furnace for 30 min and were then quenched to room temperature. The surface was then examined for flaking by means of scanning electron microscopy.

In the context of the present invention, the "object" is a component that has a surface formed from a Ni base alloy. The component can be produced as a whole from the Ni base alloy. However, it may also be that the component is produced merely in portions from a Ni base alloy. A layer thickness of the Ni base alloy is expediently selected here such that a ceramic layer can be applied thereto by means of PVD or by thermal spraying.

In accordance with an advantageous embodiment, the intermediate layer has a thickness of 0.1 μm, preferably 0.5 to 5.0 μm. As a result of the solvothermal treatment, a porosity within the ceramic layer increases from an intermediate layer in the direction of a layer surface of the ceramic layer.

The porosity of the ceramic layer with the objects in a first layer portion adjoining the intermediate layer is 0.5 to 3.0% and in a second layer portion adjoining the layer surface is 2.5 to 6.0%. The porosity is determined here by means of image evaluation on a micrograph.

It has further proven to be expedient if the Ni base alloy contains Cr in a quantity from 5 to 25% by weight. The ceramic layer further contains $Y_2O_3$ as secondary constituent in order to stabilise the $ZrO_2$. The ceramic layer can contain $Al_2O_3$ as further main constituent.

BRIEF DESCRIPTION OF THE DRAWINGS

FIG. 1 shows a schematic view of an apparatus for solvothermal treatment,

FIG. 2 shows the solubility of $ZrO_2$ over temperature depending on the composition of the gas phase.

DETAILED DESCRIPTION OF THE INVENTION

Figure 3:
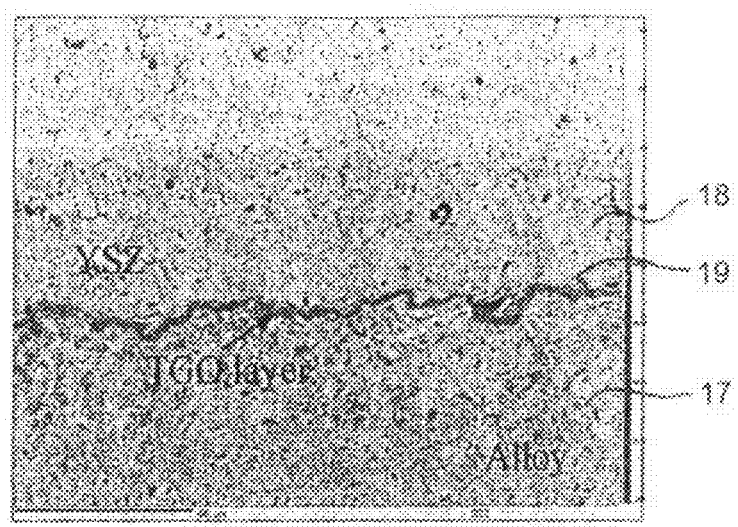
FIG. 3 shows an image recorded by SEM of a cross section through a surface of a Ni base alloy coated with the ceramic layer.

The invention will be explained in greater detail hereinafter on the basis of the drawings. With the apparatus shown in FIG. 1 for solvothermal treatment, a nitrogen gas reservoir 1 is connected via a first gas control valve 2 to a gas feed line 3. An HCl gas reservoir 4 is likewise connected to the gas feed line 3 via a second gas control valve 5. The gas feed line 3 leads into a furnace 6. As can be seen from the enlarged detail, a container 7 produced for example from quartz glass and containing a salt melt 8 is received in the furnace 6. The container 7 is advantageously coated with YSZ (not shown here) on its inner face facing the salt melt 8. The salt melt 8 can be formed in equimolar composition from $KCl$—$K_2SO_4$—$ZnCl_2$—$ZnSO_4$, for example. Reference sign 9 denotes a gas inlet or a mouth of the gas feed line 3. Reference sign 10 denotes a gas outlet or an end of a gas discharge line 11.

A test specimen 12 is arranged above the salt melt 8 in the furnace 6. The test specimen may be a steel cylinder that is coated with a Ni base alloy, wherein the Ni base alloy is in turn coated with a ceramic layer made of YSZ applied by means of thermal spraying.

The gas discharge line 11 leads into a first container 13, in which a drying agent is received. The dried waste gas is transferred from the first container 13 via a second gas discharge line 14 into a second container 15, in which a lye is received. The dried and neutralised waste gas is discharged via a waste gas line 16.

FIG. 2 shows the solubility of $ZrO_2$ depending on the temperature and depending on the composition of the gas phase. The measurement results indicated by squares show the solubility of $ZrO_2$ depending on the temperature and in the presence of an equimolar salt melt 8 made of $KCl$—$K_2SO_4$—$ZnCl_2$—$ZnSO_4$, wherein $N_2$ with an addition of 2% by weight HCl has been used as carrier gas (=model system). As can be seen from FIG. 2, $ZrO_2$ has a maximum solubility at a temperature of the melt of 700° C. By contrast, the measurement result indicated by a triangle shows that $ZrO_2$ hardly dissolves in the salt melt with an omission of HCl in the carrier gas or an omission of sulphate salts.

To determine the solubility of $ZrO_2$, test specimen bodies formed from YSZ were each treated in a predefined quantity of the salt melt 8 for 72 hours at the temperature specified in each case. The salt melt 8 was then analysed quantitatively by means of ICPMS.

FIG. 3 shows an image recorded by SEM of a cross section through a test specimen treated in accordance with the invention. Reference sign 17 denotes a conventional Ni base alloy, for example alloy 625. The Ni base alloy contains 20 to 23% by weight Cr and 8 to 10% by weight molybdenum and, as further constituents, tantalum in particular. Reference sign 18 denotes a ceramic layer that is produced from YSZ. An intermediate layer 19 is arranged between the Ni base alloy 17 and the ceramic layer 18 and here has a thickness from approximately 1.0 to 3.0 μm. The intermediate layer 19 is the result of the proposed solvothermal treatment of the test specimen. According to initial findings, it basically contains chromium oxides, possibly also proportions of chromium sulphides. If the ceramic layer as further main constituent also contains $Al_2O_3$ besides $ZrO_2$, $Al_2O_3$ is then probably also contained in the intermediate layer 19 besides $ZrO_2$.

Figure 4:
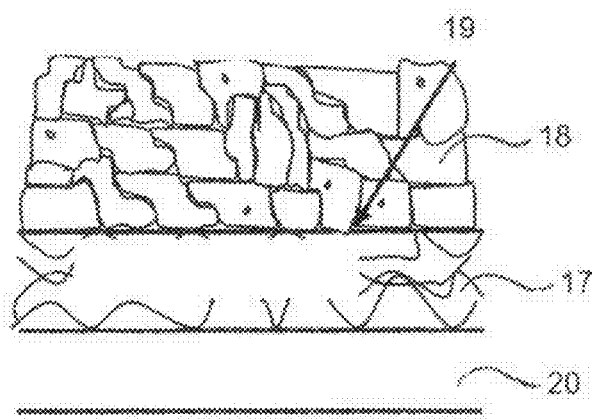
FIG. 4 shows a schematic view of a cross section through an object.

FIG. 4 shows a schematic cross section through an object that forms a substrate 20. The substrate 20 can be produced from steel, for example. The substrate 20 can be coated at least in portions with the Ni base alloy 17, which is in turn covered by the ceramic layer 18. The intermediate layer 19 is formed between the Ni base alloy 17 and the ceramic layer 18 as a result of the solvothermal treatment according to the invention of the test specimen.

As a result of the solvothermal treatment of the ceramic layer and the rearrangement processes caused thereby, the porosity of said layer decreases in the direction of the intermediate layer 19. The table below shows the dependency of the densification rate in the region of the ceramic layer 18 on temperature, HCl content in the gas phase and sulphate proportion in the salt melt 8, wherein the system $KCl-K_2SO_4-ZnCl_2-ZnSO_4$ was used as salt melt and $N_2$ was used as carrier gas:

| | Temperature (° C.) | | | | | |
|---|---|---|---|---|---|---|
| | 500 | 600 | 700 | 700 | 700 | 700 |
| HCl proportion | 2% | 2% | 2% | 4% | 8% | 2% |
| Sulphate proportion | 50% | 50% | 50% | 50% | 50% | 44% |
| Densification rate | <5 μm/d | <5 μm/d | 130 μm/d | <10 μm/d | <5 μm/d | 40 μm/d |

As can be seen from the table, particularly high recrystallisation takes place in particular at a temperature of 700° C., with an HCl content of 2% by weight and a sulphate proportion of 50 mol %, that is to say an equimolar salt melt. The densification rate or the growth rate of the densification zone in the ceramic layer is particularly high here at 130 μm/d.

Figure 5:
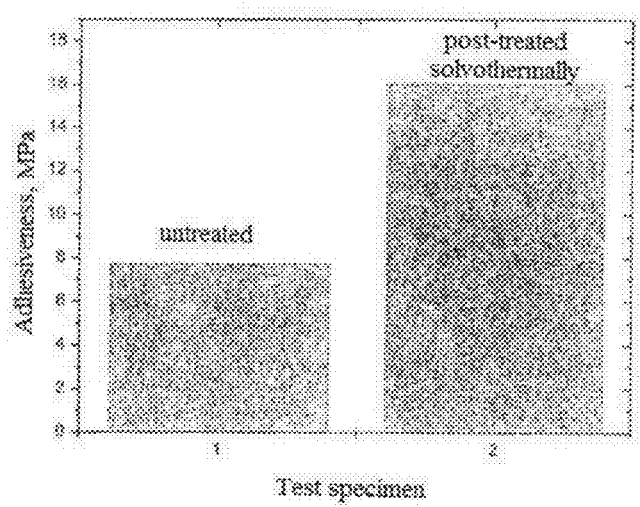
FIG. 5 shows the adhesiveness of the ceramic layer of a conventional test specimen compared with a test specimen according to the invention.

FIG. 5 shows the results of measurements of the adhesiveness of a ceramic layer made of YSZ which has been applied by means of plasma spraying to the Ni base alloy, alloy 625. In the case of the solvothermal treatment of the ceramic layer, an intermediate layer 19 with a thickness of approximately 1.0 μm has formed. As can be seen from the results, the adhesiveness of the solvothermally treated test specimen is approximately twice that of the conventional test specimen.

Figures 6A, 6B:
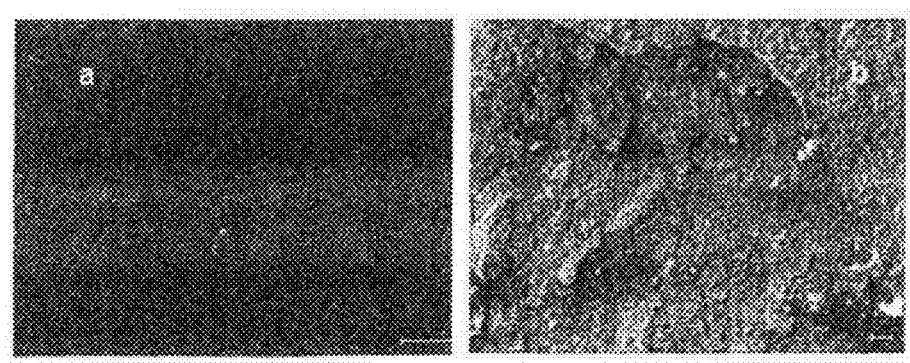
FIG. 6a shows an image recorded by SEM of a surface of a test specimen according to the invention without thermal load change.
FIG. 6b shows the surface according to FIG. 6a after 20 thermal changes.
Figure 7:
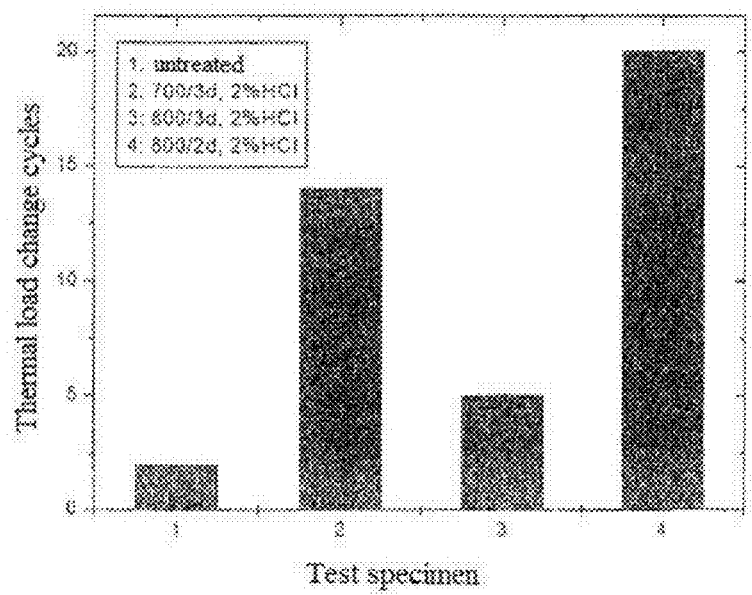
FIG. 7 shows the thermal cycle stability of a conventional test specimen compared with test specimens according to the invention.

FIGS. 6a, 6b and 7 show the results of the thermal cycle stability of the aforementioned test specimens. The thermal cycle stability has been determined by means of SEM images of the surfaces. FIG. 6a shows the surface of a solvothermally treated test specimen prior to the start of the thermal load change cycles. FIG. 6b shows the same surface after 20 thermal load change cycles. As can be seen in particular from FIG. 7, flaking of the ceramic layer is observed with untreated test specimens after just 2 thermal load change cycles. With the present tests, the thermal cycle stability was defined as the moment in time at which 20% of the ceramic layer exhibited flaking. As can be seen further from FIG. 7, some of the solvothermally treated test specimens demonstrate a drastically improved thermal shock resistance compared with the untreated test specimen.

Figure 8:
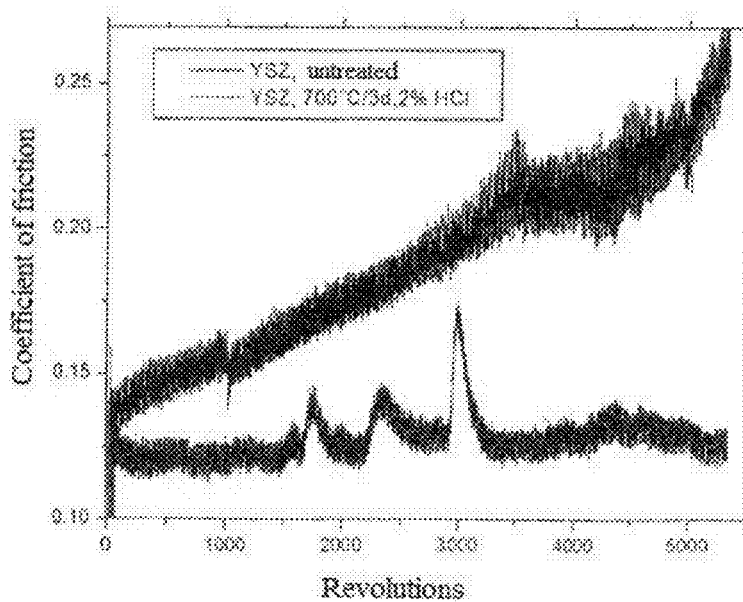
FIG. 8 shows the coefficient of friction of a conventional test specimen compared with a test specimen according to the invention.

FIG. 8 shows the tribological properties of a conventional test specimen and a solvothermally treated test specimen, of which the ceramic layer was again produced from YSZ. The measurement results shown in FIG. 8 were measured by means of a ball-on-disc tribometer in a "three ball on disc test". As can be seen from FIG. 8, the test specimens treated in accordance with the invention demonstrate a coefficient of friction that is reduced by a factor of 3.

Figure 9:
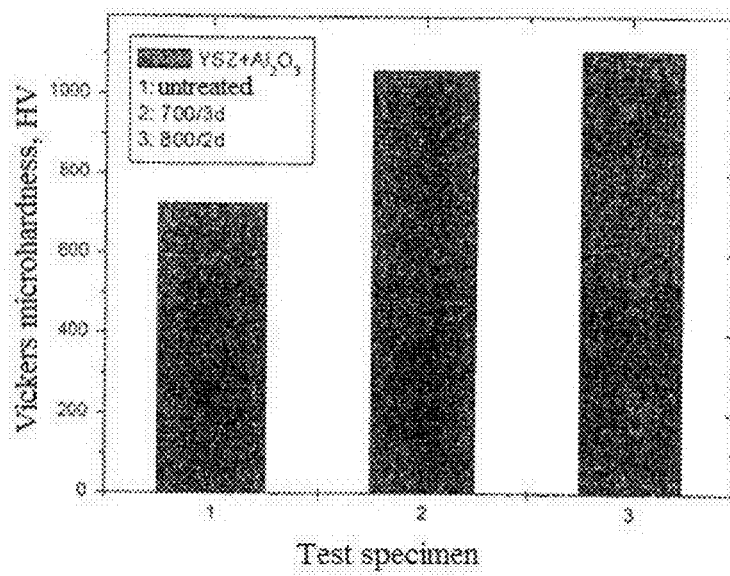
FIG. 9 shows the Vickers microhardness of a conventional test specimen compared with further test specimens according to the invention.
Figure 10:
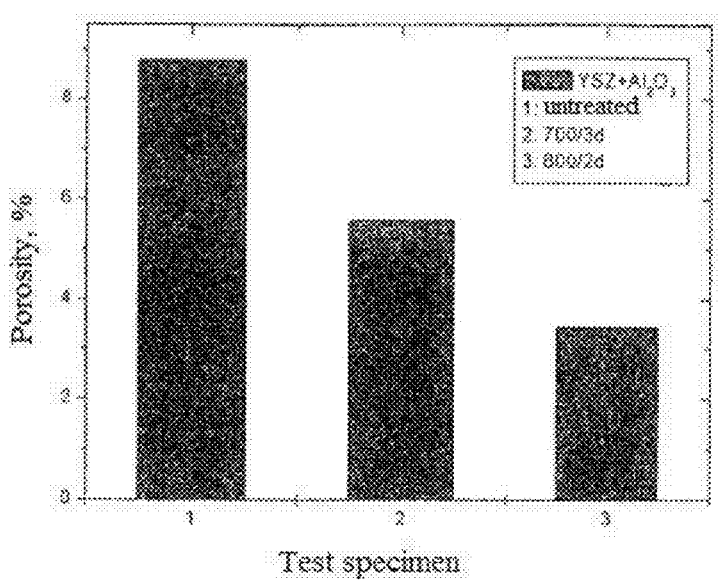
FIG. 10 shows the porosity of a conventional test specimen compared with further test specimens according to the invention.

FIGS. 9 and 10 concern results of tests on further test specimens, in which the ceramic layer was produced in each case from an equimolar mixture of YSZ and $Al_2O_3$. The ceramic layer was in turn applied by means of plasma spraying to a substrate made of a Ni base alloy, alloy 625. The solvothermal post-treatment was again performed with use of the model system described with reference to FIG. 2 at a temperature of 700° C.

As can be seen from FIG. 9, the solvothermally treated test specimens demonstrate a considerably improved Vickers microhardness. It can be seen from FIG. 10 that the solvothermally treated test specimens additionally have a drastically reduced porosity.

The reduction of porosity occurs with the solvothermally treated test specimens since YSZ and/or $Al_2O_3$ dissolve as a result of the action of the gas phase and diffuse in the direction of the interface formed by the Ni base alloy. There, recrystallisation of the dissolved ceramic phase takes place, whereby in particular the pore space of the ceramic layer in the region of the interface is filled. The solvothermally treated test specimens thus are not characterised just by the formation of an intermediate layer between the Ni base alloy and the ceramic layer, but also by a porosity within the ceramic layer decreasing from the layer surface of the ceramic layer in the direction of the interface. —Conventional layers produced by means of thermal spraying generally have a porosity in the region of 9%. By contrast, solvothermally treated ceramic layers have a drastically reduced porosity in the range from 3 to 5.50. The specified porosities relate here again to results obtained by means of image evaluation on a micrograph.

LIST OF REFERENCE SIGNS

1 nitrogen gas reservoir
2 first gas control valve
3 gas feed line
4 HCl gas reservoir
5 second gas control valve
6 furnace
7 container 8 salt melt
9 gas inlet
10 gas outlet
11 gas discharge line
12 test specimen
13 first container
14 further gas discharge line
15 second container
16 waste gas line
17 Ni base alloy
18 ceramic layer
19 intermediate layer
20 substrate

The invention claimed is:

1. A method for producing a ceramic layer on a surface formed from a Ni base alloy containing Cr in a quantity from 5 to 25% by weight, comprising:
producing on the surface a ceramic layer comprising $ZrO_2$;
producing a gas phase having a temperature in the range from 400 to 900° C., and containing gas phase components formed from a salt melt including components of alkali chloride, alkali sulphate and $ZnCl_2$, and a carrier gas formed from an inert gas with 0.5 to 10% by weight HCl, the components included in the salt melt being contained essentially in equimolar composition; and
bringing the ceramic layer into contact with the gas phase for a period of time that is sufficient for an intermediate layer having a thickness of at least 0.1 μm to form between the ceramic layer and the surface,
wherein $ZrO_2$ is contained in the ceramic layer and the gas components are contained in the gas phase, such that the gas phase components contained in the gas phase form a quaternary eutectic with $ZrO_2$ in the range from 400 to 900° C., and the HCl contained in the gas phase reacts with Cr contained in the Ni base alloy to form chromium chlorides, thereby forming the intermediate layer between the ceramic layer and the surface in the step of bringing the ceramic layer into contact with the gas phase.

2. The method according to claim 1, wherein the Ni base alloy contains Cr in a quantity from 15 to 25% by weight.

3. The method according to claim 1, wherein the ceramic layer is produced by means of physical vapor deposition or by thermal spraying.

4. The method according to claim 1, wherein the ceramic layer further contains $Y_2O_3$ in order to stabilise the $ZrO_2$.

5. The method according to claim 1, wherein the ceramic layer further contains $Al_2O_3$.

6. The method according to claim 5, wherein the ceramic layer contains 30 to 70 mol % of $Al_2O_3$.

7. The method according to claim 1, wherein $N_2$ is used as the inert gas.

8. The method according to claim 1, wherein the inert gas contains 1.0 to 4.0% by weight HCl.

9. The method according to claim 1, wherein the components in the salt melt further contain $ZnSO_4$.

10. The method according to claim 1, wherein the components in the salt melt contain following components: $KCl$—$K_2SO_4$—$ZnCl_2$—$ZnSO_4$.

11. The method according to claim 1, wherein the ceramic layer is brought into contact with the gas phase for the period of time that is sufficient for the intermediate layer having a thickness from 0.5 to 5.0 μm to form between the ceramic layer and the surface.

12. The method according to claim 1, wherein the period of time is from 1 to 100 hours.

13. The method according to claim 12, wherein the period of time is from 20 to 75 hours.

* * * * *